United States Patent [19]

Zijlstra

[11] Patent Number: 5,425,842
[45] Date of Patent: Jun. 20, 1995

[54] METHOD OF MANUFACTURING A SEMICONDUCTOR DEVICE USING A CHEMICAL VAPOUR DEPOSITION PROCESS WITH PLASMA CLEANING OF THE REACTOR CHAMBER

[75] Inventor: Piebe A. Zijlstra, Nijmegen, Netherlands

[73] Assignee: U.S. Philips Corporation, New York, N.Y.

[21] Appl. No.: 73,811

[22] Filed: Jun. 8, 1993

[30] Foreign Application Priority Data

Jun. 9, 1992 [EP] European Pat. Off. ............ 92204655

[51] Int. Cl.⁶ .......................................... H01L 21/00
[52] U.S. Cl. ................................. 156/643.1; 156/345; 134/1; 118/715; 118/723 E; 118/723 ER
[58] Field of Search ................... 134/1; 156/345, 643; 118/715, 723 E, 723 ER

[56] References Cited

U.S. PATENT DOCUMENTS

| | | | |
|---|---|---|---|
| 4,960,488 | 10/1990 | Law et al. | 156/643 |
| 5,105,761 | 4/1992 | Charlet et al. | 156/345 |
| 5,164,017 | 11/1992 | Möller et al. | 134/22.18 |
| 5,238,499 | 8/1993 | Van De Ven et al. | 118/724 |

FOREIGN PATENT DOCUMENTS

| | | |
|---|---|---|
| 574075 | 12/1993 | European Pat. Off. |
| 2122626 | 5/1990 | Japan . |
| 2122626 | 5/1990 | Japan . |
| 4056770 | 2/1992 | Japan . |

Primary Examiner—Nam Nguyen
Assistant Examiner—George Goudreau
Attorney, Agent, or Firm—Steven R. Biren

[57] ABSTRACT

A method of manufacturing a semiconductor device includes the step of providing a reaction chamber (3) in which a layer of material (2) is deposited on a semiconductor slice (1) which is placed on a support (4) in the reaction chamber, a process gas being conducted towards the slice (1) through a gas inlet system (6) which is provided with a perforated gas inlet plate (9) arranged opposite the support (4). The reaction chamber is, between depositions, periodically cleaned through generation of a plasma between the support (4) and the gas inlet plate (9) in a gas mixture comprising fluorine or a fluorine compound and oxygen or an oxygen compound. A portion of the gas mixture which is comparatively rich in oxygen is conducted into the reaction chamber through the gas inlet system (6) with the gas inlet plate (9), while a portion of the gas mixture comparatively poor in oxygen is conducted into the reaction chamber through an auxiliary inlet system (23). The cleaning plasma as a result is comparatively rich in oxygen close to the gas inlet plate. An attack on the gas inlet plate by the plasma is counteracted in this way, and deposition on the gas inlet plate of polymers formed in the plasma is suppressed. An optimum cleaning plasma is present on average between the gas inlet plate (9) and the support (4).

5 Claims, 1 Drawing Sheet

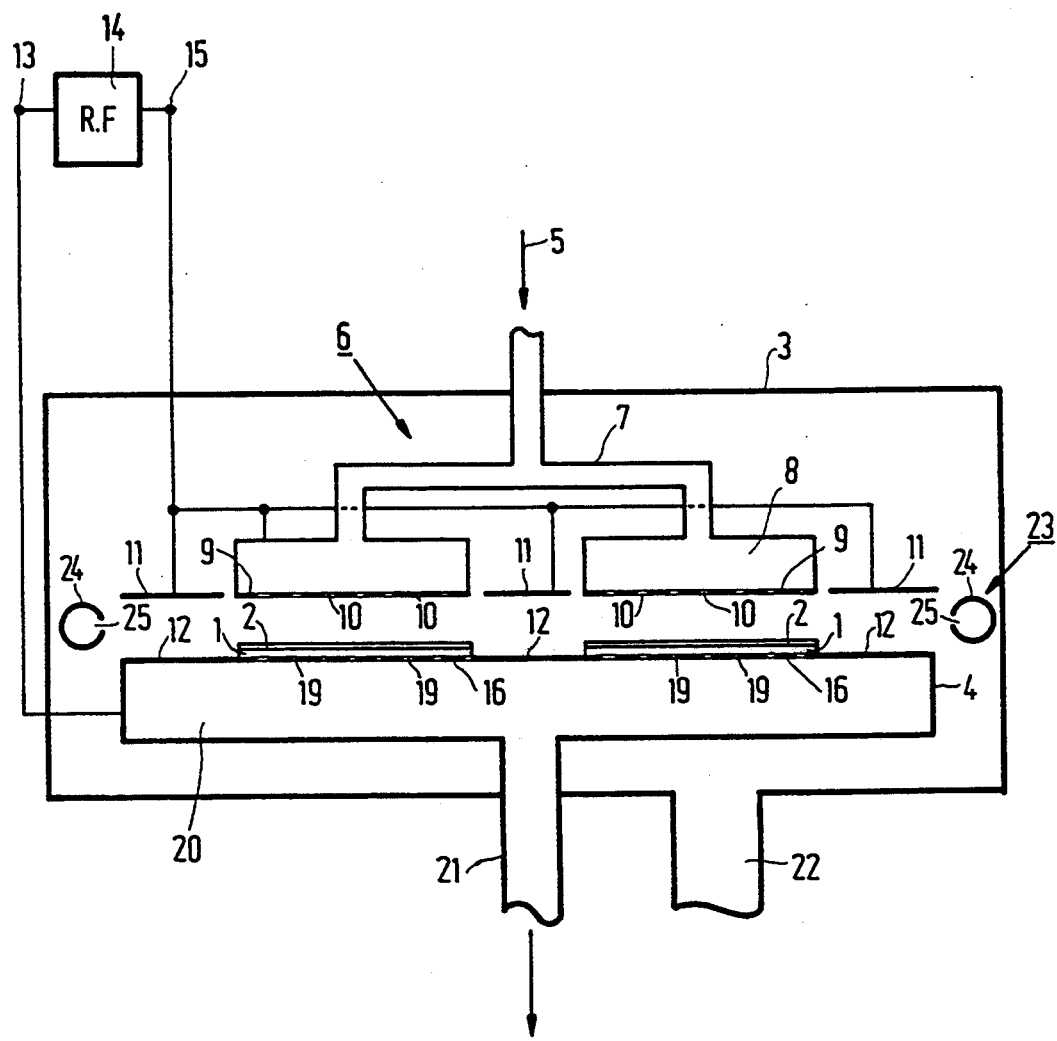

METHOD OF MANUFACTURING A SEMICONDUCTOR DEVICE USING A CHEMICAL VAPOUR DEPOSITION PROCESS WITH PLASMA CLEANING OF THE REACTOR CHAMBER

BACKGROUND OF THE INVENTION

The invention relates to a method of manufacturing a semiconductor device whereby a reaction chamber in which a layer of material is deposited on a semiconductor slice placed on a support in the reaction chamber, whereby a process gas is conducted towards the slice through a gas inlet system which is provided with a perforated gas inlet plate arranged opposite the support, between depositions is cleaned periodically through the generation of a plasma between the support and the gas inlet plate in a gas mixture comprising fluorine or a fluorine compound and oxygen or an oxygen compound.

During such a deposition process, for example, a layer of silicon, silicon oxide, silicon nitride, tungsten, or titanium nitride is deposited on the semiconductor slice. During this, the slice is heated to a temperature of 400° to 800° C. in a chemical vapour deposition process, after which the process gas is conducted towards the slice. In the case of a plasma-enhanced chemical vapour deposition process, a plasma is generated between the support and the gas inlet plate. The said process gas then comprises a gaseous silicon compound, a gas mixture comprising a silicon compound and oxygen or an oxygen compound, a gas mixture comprising a silicon compound and nitrogen or a nitrogen compound, a tungsten compound, and a titanium compound, respectively. Usual silicon compounds are silane, dichlorosilane and tetraethoxysilane, while a usual oxygen compound is laughing gas and a usual nitrogen compound ammonia.

The process gas is conducted towards the slice placed on the support through a perforated gas inlet plate which is positioned opposite the support. The gas inlet plate is, for example, an aluminium plate in which a large number of holes with a diameter of, for example, 1 mm are provided, regularly distributed over its surface. The plate may also be manufactured from a porous material, such as sintered aluminium powder. Such a plate is perforated by means of channels which are present in the sintered material. The use of such a perforated gas inlet plate achieves that the process gas is homogeneously distributed over the slice, so that a homogeneous deposition is obtained. The gas inlet plate has a diameter which is at least equal to that of the slice.

A support for a single slice may be arranged in the process chamber, but alternatively there may be a support on which several slices may be arranged next to one another. In the former case, the chamber comprises a gas inlet system with a single gas inlet plate, in the latter case one with a comparatively large gas inlet plate or with several gas inlet plates.

During the deposition process a layer of material is deposited not only on the slice, but also on chamber components which are situated near the slice. When the deposition process is repeated, layers being deposited on subsequent slices, the layer on these chamber components increases in thickness. When the layer on the chamber components becomes too thick, particles may flake off from this layer and end up on the slice. These particles are undesirable there. Accordingly, the reaction chamber must be cleaned periodically.

An effective cleaning can be obtained when the reaction chamber is cleaned through generation of a plasma between the support and the gas inlet plate in a gas mixture comprising fluorine or a fluorine compound and oxygen or an oxygen compound which is conducted into the reaction chamber. Practical gas mixtures are, for example, a mixture of $CF_4$ and $O_2$, a mixture of $SF_6$ and $N_2O$, or a mixture of $C_2F_6$ and $O_2$, which exhibit a maximum cleaning effect when 10 to 30 vol. %, 30 to 50 vol. % and 40 to 60 vol. % $O_2$ are added to them, respectively. The materials mentioned above can be very effectively removed by means of such plasmas.

U.S. Pat. No. 4,960,488 discloses a method of the kind mentioned in the opening paragraph whereby the gas mixture is conducted into the reaction chamber through the gas inlet plate.

It is found with the use of the known method that the chamber components close to the slice can be well cleaned. The known method, however, also has disadvantages. Thus the gas inlet plate is sometimes locally attacked by the cleaning process and sometimes undesirable particles still end up on the slices. Practically no particles arrive at the slices any more which contain the material which is deposited in the reaction chamber during the deposition process, but particles of a material having a different composition do. It is found that the composition depends on the fluorine compound used during cleaning. When a fluorine-carbon compound is used, the particles contain carbon, when a fluorine-sulphur compound is used, the particles contain sulphur.

SUMMARY OF THE INVENTION

The invention has for its object inter alia to counteract the aforementioned disadvantages. According to the invention, the method mentioned in the opening paragraph is for this purpose characterized in that a portion of the gas mixture which is comparatively rich in oxygen is conducted into the reaction chamber through the gas inlet system with the gas inlet plate, while a portion of the gas mixture which is comparatively poor in oxygen is conducted into the reaction chamber through an auxiliary inlet system.

A plasma generated in a gas mixture comprising fluorine or a fluorine compound and oxygen or an oxygen compound has its optimum cleaning effect when a certain quantity of oxygen or oxygen compound is present in the gas mixture. In the examples given above, this was, for example, 10 to 30 vol. %, 30 to 50 vol. % or 40 to 60 vol. % oxygen or oxygen compound. Cleaning takes longer when the gas mixture comprises more or less than this optimum quantity. The oxygen in the gas mixture in addition suppresses the formation of polymers containing carbon or sulphur, and thus the deposition of particles comprising carbon or sulphur. A portion of the gas mixture comparatively rich in oxygen should herein be understood to mean a portion of the gas mixture having a composition ratio with more than the optimum quantity of oxygen or oxygen compound, while a portion comparatively poor in oxygen is a portion with a composition with less than this optimum quantity.

Since a portion of the gas mixture comparatively rich in oxygen flows through the gas inlet plate, the cleaning plasma close to the gas inlet plate is comparatively rich in oxygen. It is achieved by this that cleaning progresses less quickly near the gas inlet plate, so that an attack of the gas inlet plate is counteracted. In addition, the comparatively large quantity of oxygen in the plasma also suppresses the deposition of carbon or sulphur particles on the gas inlet plate. Such particles could arrive on the slices, as is the case in the known method described. The fact that a portion of the gas mixture poor in oxygen is introduced into the reaction chamber through a separate auxiliary inlet system achieves that on average a gas mixture of optimum composition is present between the gas inlet plate and the holder, so that the plasma has an optimum effectiveness except for the regions close to the gas inlet plate and close to the auxiliary inlet system.

Preferably, according to the invention, the portion of the gas mixture comparatively rich in oxygen is also conducted into the reaction chamber through openings in the support arranged in the reaction chamber. A slice is present on the support during deposition, so that practically no material ends up on the portion of the holder then covered by this slice. Practically no material need accordingly be removed from this surface during cleaning. When a portion of the gas mixture rich in oxygen is fed through openings in the support, it is achieved that the holder is cleaned less intensively, so that an attack by the plasma is counteracted.

This measure can be very easily realized when the support is already provided with gas ducts for other reasons. This is the case with supports provided with suction openings for fixing the slices on the support during deposition by means of vacuum, and with holders provided with gas ducts for realizing a heat-conducting gas cushion between slice and support during deposition. Such supports are of an intricate construction and accordingly expensive. It is of special interest to counteract attacks by the cleaning plasma in the case of these expensive supports.

The attack on the gas inlet plate and the deposition of particles on the gas inlet plate are counteracted most strongly when the portion of the gas mixture comparatively rich in oxygen does not comprise fluorine or a fluorine compound from the gas mixture. The gas mixture conducted into the chamber through the gas inlet plate and possibly through the openings in the support then comprises only the oxygen or oxygen compound of the gas mixture, but not the fluorine or fluorine compound. The cleaning action of the plasma is then at a minimum near the gas inlet plate and possibly near the support, while also the deposition of, for example, carbon particles on these chamber components is at a minimum then.

The cleaning process can be easily implemented in practice when the portion of the gas mixture comparatively rich in oxygen also comprises all oxygen or all oxygen compound from the gas mixture. The oxygen or oxygen compound is then conducted into the reaction chamber fully separate from the fluorine or fluorine compound. As a result, the two flows may readily be adjusted completely independently of one another, whereby attach on the gas inlet plate and deposition of undesirable particles can be prevented as well as possible, while the cleaning action of the plasma is an optimum.

BRIEF DESCRIPTION OF THE DRAWING

The invention is explained in more detail below by way of example with reference to a drawing in which a device suitable for carrying out the method according to the invention is shown diagrammatically and in cross-section.

DESCRIPTION OF THE PREFERRED EMBODIMENTS

The drawing diagrammatically and in cross-section shows a device for carrying out a method for manufacturing a semiconductor device, whereby a layer of material 2 is deposited on a semiconductor slice 1 in that the slice 1 is placed on a support 4 in a reaction chamber 3. During the deposition process, diagrammatically indicated by an arrow 5, a process gas is conducted towards the slice 1 through a gas inlet system 6. During this, the slice is heated in usual manner to a temperature of 400° to 800° C. in the case of a "chemical vapour deposition process". In the case of a "plasma-enhanced chemical vapour deposition process", a plasma is generated in usual manner between the support and the gas inlet plate.

The gas inlet system 6 comprises a number of tubes 7 and a gas inlet chamber 8 of which a wall forms a perforated gas inlet plate 9 arranged opposite the support 4. The gas inlet plate 9 is, for example, an aluminium plate in which a large number of holes with a diameter of, for example, 1 mm are provided, evenly distributed over its surface. The plate may also be manufactured from a porous material, such as sintered aluminium powder. Such a plate is perforated by means of channels present in the sintered material. The use of such a perforated gas inlet plate 9 achieves that the process gas 5 is homogeneously distributed over the slice 1, so that a homogeneous deposition is obtained. The gas inlet plate 9 as a diameter which is at least equally large as that of the slice and which is, for example, 15 cm.

A support 4 for a single slice 1 may be arranged in the process chamber 3, but alternatively there may be a support 4 on which several slices, such as two slices in the present example, may be placed next to one another. In the former case the chamber 3 comprises a gas inlet system 6 with a single gas inlet plate 9, in the latter case a system with several gas inlet plates 9.

A layer 2 of silicon, silicon oxide or silicon nitride, tungsten or titanium nitride, for example, is deposited on the semiconductor slice 1 during the deposition process. The process gas then comprises a gaseous silicon compound, a gas mixture with a silicon compound and oxygen or an oxygen compound, a gas mixture with a silicon compound and nitrogen or a nitrogen compound, a tungsten compound, or a titanium compound, respectively, in these cases. Usual silicon compounds are silane, dichlorosilane, and tetraethoxysilane, a usual oxygen compound is laughing gass, and a usual nitrogen compound is ammonia.

A layer of material 2 is deposited not only on the slice 1 during the deposition process, but also on chamber components situated in the vicinity of the slice. These are, for example, screens 11 positioned around the gas inlet plates and the portion 12 of the support 4 not covered by slices 1. When the deposition process is repeated, layers being deposited on other slices, the layer on these chamber components increases in thickness. When the layer on the chamber components becomes too thick, particles may flake off from this layer, and end up on the slice. These particles are undesirable there. Accordingly, the reaction chamber 3 is cleaned periodically in that a plasma is generated between the support 4 and the gas inlet plate 9 in a gas mixture comprising fluorine or a fluorine compound and oxygen or an oxygen compound. The support 4 is for this purpose connected to one of the poles 13 of a usual HF generator 14 operating at 13,5 MHz, while the gas inlet plates 9 and the screens 11 are connected to the other pole 15 of this generator 14.

Practical gas mixtures for this cleaning are, for example, a mixture of $CF_4$ and $O_2$, a mixture of $SF_6$ and $N_2O$, or a mixture of $C_2F_6$ and $O_2$, which have a maximum cleaning action when 10 to 30 vol. %, 30 to 50 vol. % or 40 to 60 vol. % $O_2$, respectively, are added thereto. The materials mentioned above such as silicon, silicon oxide, and silicon nitride can be very effectively removed by means of such plasmas. The support in this example is provided with a contact plate 16 on which the slices 1 can be placed and which is provided with suction openings 19. The support further comprises a vacuum chamber 20 which is connected to a vacuum pump (not shown) through a line 21. During the deposition the vacuum chamber 20 is then brought to a low pressure, so that the slices 1 are retained on the support through the openings 19 by vacuum.

Residual gases, such as unused reaction gases and gases evolved during the deposition are removed from the reaction chamber 3 through a suction opening 22.

During cleaning of the reaction chamber 3, according to the invention, a portion of the gas mixture comparatively rich in oxygen is conducted into the reaction chamber through the gas inlet system 5 comprising the gas inlet plate 9, while a portion of the gas mixture comparatively poor in oxygen is conducted into the reaction chamber through an auxiliary inlet system 23. The auxiliary inlet system in this example comprises a tube 24 surrounding the support 4 and provided with gas outlet openings 25. The gas used for cleaning should then be fed into the tube 24 through a line which is not shown in the drawing.

The plasma generated in a gas mixture comprising fluorine or a fluorine compound and oxygen or an oxygen compound has its optimum cleaning effect when a certain quantity of oxygen or oxygen compound is present in the gas mixture. In the examples given above, for example, this was 10 to 30 vol. %, 30 to 50 vol. % or 40 to 60 vol. % oxygen or oxygen compound. Cleaning takes longer when the gas mixture contains more or less than this optimum quantity. A portion of the gas mixture comparatively rich in oxygen is a portion of the gas mixture having a composition ratio with more than the optimum quantity of oxygen or oxygen compound, while a portion comparatively poor in oxygen is a portion containing less than this optimum quantity. A good cleaning was obtained in that a gas mixture of 600 scc $C_2F_6$ and 1200 scc $O_2$ per minute was fed through the gas inlet plate 9, and a gas mixture of 1200 scc $C_2F_6$ and 600 scc $O_2$ per minute through the tube 24.

Since a portion of the gas mixture comparatively rich in oxygen flows through the gas inlet plate, the cleaning plasma close to the gas inlet plate 9 is comparatively rich in oxygen. It is achieved by this that cleaning progresses less quickly near the gas inlet plate 9, so that attacks on the gas inlet plate 9 are counteracted. The comparatively large quantity of oxygen in the plasma in addition suppresses the deposition of carbon or sulphur particles on the gas inlet plate 9. Such particles could end up on the slices 1. The conduction of a portion of the gas mixture poor in oxygen through the auxiliary inlet system 23 into the reaction chamber 3 achieves that on average nevertheless a gas mixture of optimum composition is present between the gas inlet plates 9 and the support 4, so that the plasma has an optimum effectiveness except for the regions close to the gas inlet plates 9 and close to the auxiliary inlet system 23.

Preferably, according to the invention, the portion of the gas mixture comparatively rich in oxygen is also conducted into the reaction chamber 3 through openings 19 in the support 4 arranged in the reaction chamber 3. Slices 1 are present on the support 4 during deposition, so that practically no material is deposited on the portion of the support 4 covered by these slices then. So substantially no material is to be removed from this surface during cleaning. When a portion of the gas mixture rich in oxygen is fed through the openings 19, it is also achieved that the support is cleaned less thoroughly, so that attacks by the plasma are conteracted. A good cleaning action with substantially no attack on the gas inlet plate 9 and the support 4 is obtained when a gas mixture of 300 scc $C_2F_6$ and 600 scc $O_2$ is fed through the gas inlet plate 9 and through the support 4, while a gas mixture of 1200 scc $C_2F_6$ and 600 scc $O_2$ is fed through the tube 24.

The attack of the gas inlet plate 9 and the deposition of particles on the gas inlet plate 9 are counteracted most strongly when the portion of the gas mixture comparatively rich in oxygen contains no fluorine or fluorine compound from the gas mixture. The gas mixture fed through the gas inlet plate 9 and possibly through the openings 19 in the support 4 into the chamber 3 then contains only the oxygen or the oxygen compound of the gas mixture, but not the fluorine or the fluorine compound. The cleaning action of the plasma is then at a minimum near the gas inlet plate 9 and possibly near the support 4, while also the deposition of, for example, carbon particles on the chamber components 10, 11 and 12 is at a minimum then. In practice, for example, 600 scc $O_2$ per minute is then fed through the gas inlet plate 9, 600 scc $O_2$ through the support 4, and a gas mixture of 600 scc $O_2$ and 1800 scc $C_2F_6$ through the ring 24.

The cleaning process can be readily implemented in practice when the portion of the gas mixture comparatively rich in oxygen also comprises all oxygen or all oxygen compound. The oxygen or oxygen compound is then fed into the reaction chamber completely separate from the fluorine or fluorine compound. As a result, the two flows may be easily adjusted fully independently of one another, so that attacks on the gas inlet plate and deposition of undesirable particles can be prevented as well as possible, while the cleaning action of the plasma is an optimum. In practice, for example, 900 scc $O_2$ per minute is fed through the gas inlet plate 9, 900 scc $O_2$ through the support 4, and 1800 scc $C_2F_6$ through the ring 24.

I claim:

1. A method of manufacturing a semiconductor device in which a reaction chamber is provided in which a layer of material is deposited on a semiconductor slice placed on a support in the reaction chamber, a process gas is conducted towards the slice through a gas inlet system which is provided with a perforated gas inlet plate arranged opposite the support, and between depositions the reaction chamber is cleaned through the generation of a plasma between the support and the gas inlet plate in a gas mixture comprising one of fluorine and a fluorine compound and one of oxygen and an oxygen compound, characterized in that a portion of the gas mixture which is rich in oxygen is conducted into the reaction chamber through the gas inlet system with the gas inlet plate, and a portion of the gas mixture which is poor in oxygen is conducted into the reaction chamber through an auxiliary inlet system.

2. A method as claimed in claim 1, characterized in that the portion of the gas mixture rich in oxygen is also conducted into the reaction chamber through openings in the support arranged in the reaction chamber.

3. A method as claimed in claim 1, characterized in that the portion of the gas mixture rich in oxygen is free from fluorine and a fluorine compound from the gas mixture.

4. A method as claimed in claim 3, characterized in that the portion of the gas mixture rich in oxygen consists essentially of one of all oxygen and an all-oxygen compound from the gas mixture.

5. A method as claimed in claim 1, characterized in that the auxiliary inlet system comprises a tube surrounding the support and provided with gas outlet openings.

* * * * *